US011666951B2

(12) United States Patent
Liao et al.

(10) Patent No.: US 11,666,951 B2
(45) Date of Patent: Jun. 6, 2023

(54) WAFER HANDLER CLEANING TOOL

(71) Applicant: Taiwan Semiconductor Manufacturing Company Limited, Hsinchu (TW)

(72) Inventors: Heng-Wei Liao, Taichung (TW); Kuo-Hua Wang, Hsinchu (TW); Ming-Tsai Kuan, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 310 days.

(21) Appl. No.: 16/946,890

(22) Filed: Jul. 10, 2020

(65) Prior Publication Data

US 2022/0008966 A1 Jan. 13, 2022

(51) Int. Cl.
  *B08B 1/00* (2006.01)
  *B08B 7/04* (2006.01)
  *B08B 5/04* (2006.01)
  *H01L 21/67* (2006.01)
  *H01L 21/687* (2006.01)

(52) U.S. Cl.
  CPC ............... *B08B 7/04* (2013.01); *B08B 1/005* (2013.01); *B08B 5/04* (2013.01); *H01L 21/67103* (2013.01); *H01L 21/68707* (2013.01)

(58) Field of Classification Search
  CPC .. B08B 7/04; B08B 1/005; B08B 5/04; B08B 13/00; H01L 21/67103; H01L 21/68707; H01L 21/67046; H01L 21/67028; H01L 21/67011; H01L 21/677
  See application file for complete search history.

(56) References Cited

U.S. PATENT DOCUMENTS

| 9,165,810 | B2* | 10/2015 | Hiroki | ............... | H01L 21/67766 |
| 2012/0211029 | A1* | 8/2012 | Pandit | ...................... | B08B 5/00 134/21 |
| 2012/0234364 | A1* | 9/2012 | Muramoto | ........ | H01L 21/67766 134/104.1 |
| 2019/0131119 | A1* | 5/2019 | Wang | ...................... | B23P 6/00 |

FOREIGN PATENT DOCUMENTS

KR  20110005969 A  *  1/2011  ............. B08B 7/028

OTHER PUBLICATIONS

Machine translation of KR-20110005969-A (Year: 2011).*

* cited by examiner

*Primary Examiner* — Erin F Bergner
(74) *Attorney, Agent, or Firm* — Harrity & Harrity, LLP

(57) ABSTRACT

A wafer handler cleaning tool may include a scraping device positioned near semiconductor equipment (e.g., a cooling plate, a semiconductor processing device, and/or the like) such that the scraping device removes foreign objects, debris, and/or other types of matter from the underside of the wafer handler when the wafer handler loads a wafer into the semiconductor equipment and/or unloads the wafer from the semiconductor equipment. Moreover, the wafer handler cleaning tool may include a negative pressure device to draw the removed foreign objects, debris, and/or other types of matter away from the scraping device and toward a filtration device such that the filtration device captures the removed foreign objects, debris, and/or other types of matter.

20 Claims, 9 Drawing Sheets

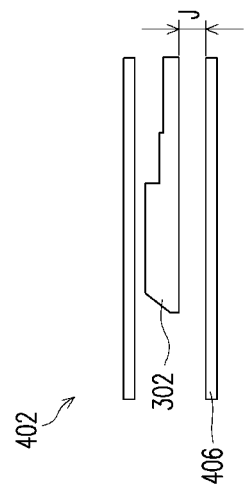
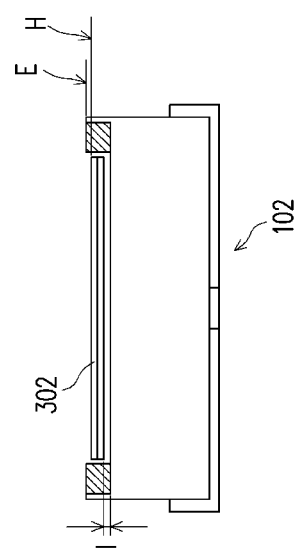
FIG. 5C
FIG. 5D

WAFER HANDLER CLEANING TOOL

BACKGROUND

A robotic arm is a device that is used to transfer wafers between various locations and/or processing equipment in a semiconductor processing facility.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5D are diagrams illustrating example parameters for a scraping device, a wafer handler, and a wafer cassette slot.

DETAILED DESCRIPTION

Figure 1A:
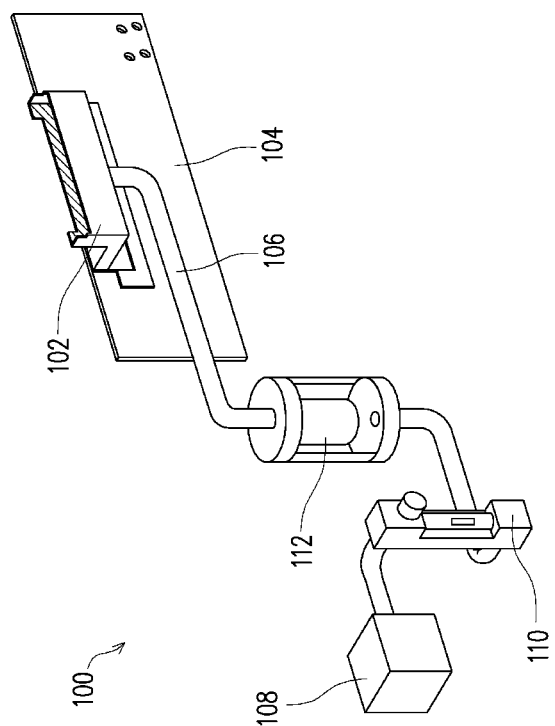
FIGS. 1A and 1B are diagrams of an example wafer handler cleaning tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a robotic arm may transfer a wafer between a wafer cassette (e.g., a container that is configured to store a plurality of wafers) and a semiconductor processing chamber or chill plate. The wafer cassette may include a plurality of slots, where each slot is configured to store a wafer. Wafers may be placed in the wafer cassette before and/or after processing.

The robotic arm may include a wafer handler or pincette that is configured and/or shaped to hold a wafer. In some cases, foreign objects (e.g., plastic fibers from device packaging, dust particles, and/or other types of foreign objects), debris, and/or other types of matter may cling to the underside (or bottom) of the wafer handler (e.g., due to an electrostatic charge). These foreign objects, debris, and/or other types of matter on the underside of the wafer handler can cause physical damage (e.g., a scratch and/or the like) to a wafer when the wafer handler loads or unloads another wafer in a slot above the wafer in a wafer cassette. This physical damage may result in rework and/or repairs to the wafer, may result in the wafer being scrapped, and/or the like.

Some implementations described herein provide a wafer handler cleaning tool that is capable of removing foreign objects, debris, and/or other types of matter from the underside of a wafer handler of a robotic arm. The wafer handler cleaning tool includes a scraping device positioned near semiconductor processing equipment (e.g., a cooling plate, a semiconductor processing device, and/or the like) such that the scraping device removes foreign objects, debris, and/or other types of matter from the underside of the wafer handler when the wafer handler loads a wafer into the semiconductor equipment and/or unloads the wafer from the semiconductor equipment. Moreover, the wafer handler cleaning tool may include a negative pressure device to draw the removed foreign objects, debris, and/or other types of matter away from the scraping device and toward a filtration device such that the filtration device captures the removed foreign objects, debris, and/or other types of matter.

In this way, the wafer handler cleaning tool may clean the underside of the wafer handler prior to the wafer handler transferring a wafer to and/or from a wafer cassette. This reduces the likelihood of and/or prevents damage from occurring to another wafer that is loaded in a slot below the wafer in the wafer cassette. Moreover, the wafer handler cleaning tool may automatically clean the underside of the wafer handler, which reduces the downtime of the wafer handler that would otherwise result from manual cleaning of the wafer handler and allows for the wafer handler to be cleaned more frequently.

Figure 1B:
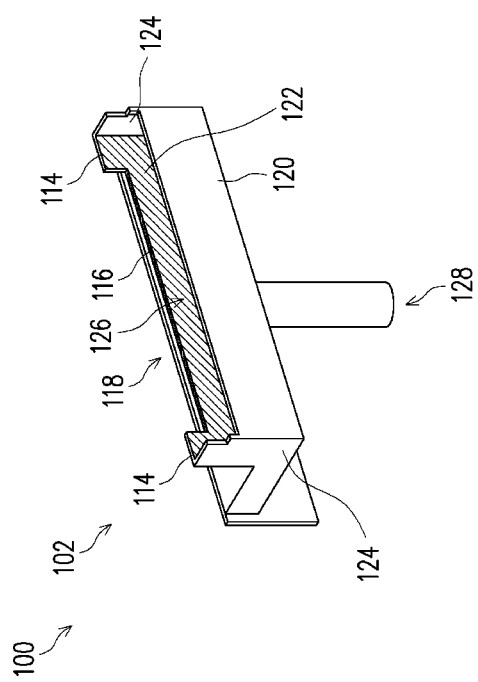

FIGS. 1A and 1B are diagrams of an example wafer handler cleaning tool 100 described herein. Wafer handler cleaning tool 100 may be a device or a set of devices configured to remove foreign objects, debris, and/or other types of matter from an underside of a wafer handler included in a robotic arm. The robotic arm may be configured to transfer wafers between a wafer cassette and semiconductor processing equipment, such as a semiconductor processing chamber, a transition chill plate (TCP), and/or the like.

As shown in FIG. 1A, wafer handler cleaning tool 100 may include various components, such as a scraping device 102, a mounting plate 104, a drain line 106, a negative pressure device 108, a flow meter 110, and a filtration device 112. Scraping device 102 may be a component configured to remove foreign objects, debris, and/or other types of matter from the underside of the wafer handler. Scraping device 102 may be formed of one or more materials, such as a metal, a plastic, a rubber, a composite, another material, and/or a combination thereof. Scraping device 102 may be attached to, connected to, or integrated with mounting plate

104. Mounting plate 104 may attach, connect, mount, and/or otherwise secure scraping device 102 to a semiconductor processing equipment. Mounting plate 104 may attach to a front side of the semiconductor processing equipment at or near an opening of the semiconductor processing equipment. Mounting plate 104 may be formed of one or more materials, such as a metal, a plastic, a composite, another material, and/or a combination thereof.

The foreign objects, debris, and/or other types of matter removed from the underside of the wafer handler by scraping device 102 may be provided to drain line 106. Drain line 106 may connect to scraping device 102 and may collect the foreign objects, debris, and/or other types of matter removed from the underside of the wafer handler. Drain line 106 may be a flexible or rigid pipe, tube, and/or a combination thereof. The inside diameter of drain line 106 may be sized according to the expected sizes of the foreign objects, debris, and/or other types of matter to be removed from the underside of the wafer handler.

Negative pressure device 108 may include a pump, a fan, a motor, or another type of device capable of generating a negative pressure in drain line 106. The negative pressure in drain line 106 draws the removed foreign objects, debris, and/or other types of matter away from scraping device 102 and into drain line 106. Flow meter 110 may be a mass flow meter, an electromagnetic flow meter, or another type of flow meter that is capable of measuring a flow rate of air through drain line 106. Moreover, flow meter 110 may provide an indication of the flow rate through drain line 106 such that the flow rate can be observed to determine whether wafer handler cleaning tool 100 is operating within acceptable operating parameters.

Filtration device 112 may include various types of air filters, such as a paper filter, a metal mesh filter, and/or the like. Filtration device 112 may be positioned between and connected to two portions or sections of drain line 106 such that air drawn through drain line 106 by negative pressure device 108 passes through filtration device 112. In this way, foreign objects, debris, and/or other types of matter drawn through drain line 106 by the negative pressure generated by negative pressure device 108 are trapped or captured by filtration device 112. Moreover, filtration device 112 may be positioned along drain line 106 prior to flow meter 110 such that filtration device 112 filters foreign objects, debris, and/or other types of matter before the foreign objects, debris, and/or other types of matter reaches flow meter 110 and causes a blockage at flow meter 110. Filtration device 112 may include a canister or another type of housing in which a filter is inserted. The housing may be opened to remove the filter for cleaning or replacement, such as in situations where flow meter 110 indicates that the negative pressure in drain line 106 does not satisfy a negative pressure threshold.

As shown in FIG. 1B, scraping device 102 may include a pair of sidewalls 114 and a scraping edge 116. Sidewalls 114 may be formed on opposing sides of scraping edge 116. Sidewalls 114 may be formed to a raised height relative to the height of scraping edge 116 to form an opening 118 through which the wafer handler may travel. The height of scraping edge 116 may be configured such that scraping edge 116 removes foreign objects, debris, and/or other types of matter from the underside (or bottom) of the wafer handler when the wafer handler travels through opening 118.

In some implementations, scraping edge 116 may remove or scrape foreign objects, debris, and/or other types of matter from the underside of the wafer handler that are sized equal to or greater than a gap size between scraping edge 116 and the underside of the wafer handler. In these examples, scraping edge 116 does not physically touch the wafer handler. In some implementations, scraping edge 116 may remove or scrape foreign objects, debris, and/or other types of matter from the underside of the wafer handler by physically contacting (e.g., scraping or rubbing against) the underside of the wafer handler.

As further shown in FIG. 1B, scraping device 102 may include a front wall 120, a back wall 122, and a plurality of sidewalls 124. Sidewalls 114 and scraping edge 116 may be part of back wall 122. Front wall 120, back wall 122, and sidewalls 124 may form a trough 126. Trough 126 may be sized and configured to collect foreign objects, debris, and/or other types of matter removed from the underside of the wafer handler. The foreign objects, debris, and/or other types of matter removed from the underside of the wafer handler may be drawn into trough 126 by gravity and/or the negative pressure generated by negative pressure device 108. The foreign objects, debris, and/or other types of matter removed from the underside of the wafer handler may collect at the bottom of trough 126 and may be drawn through a drain port 128 at the bottom of trough 126. Drain port 128 may connect to drain line 106.

The number and arrangement of components shown in FIGS. 1A and 1B are provided as an example. In practice, wafer handler cleaning tool 100 may include additional components, fewer components, different components, or differently arranged components than those shown in FIGS. 1A and 1B.

Figure 2:
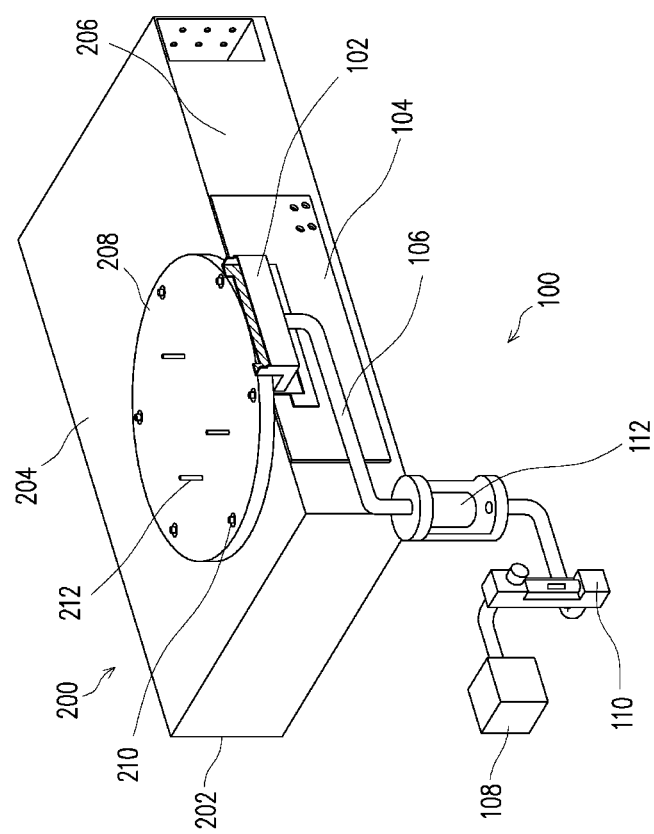
FIG. 2 is a diagram of an example transition chill plate including the wafer handler cleaning tool of FIGS. 1A and 1B.

FIG. 2 is a diagram of an example transition chill plate (TCP) 200 including wafer handler cleaning tool 100. Wafer handler cleaning tool 100 may be a device or a set of devices configured to remove foreign objects, debris, and/or other types of matter from an underside of a wafer handler included in a robotic arm. The robotic arm may be configured to transfer wafers between a wafer cassette and TCP 200.

As shown in FIG. 2, TCP 200 may include a housing 202, an upper surface 204, a front surface 206, and a chill plate 208. Chill plate 208 may be positioned on upper surface 204 and secured to upper surface 204 by fasteners 210 (e.g., screws, bolts, rivets, clips, and/or other types of fasteners). Chill plate 208 may be configured to cool a wafer positioned above chill plate 208 and placed on support pins 212. Mounting plate 104 of wafer handler cleaning tool 100 may be attached, connected, and/or otherwise secured to front surface 206 of TCP 200.

Scraping device 102 may be positioned such that scraping edge 116 removes foreign objects, debris, and/or other types of matter removed from the underside of the wafer handler as the wafer handler passes through opening 118 in scraping device 102. In particular, scraping device 102 may be positioned such that the height of scraping edge 116 relative to the height of support pins 212 causes scraping edge 116 to remove foreign objects, debris, and/or other types of matter from the underside of the wafer handler as the wafer handler loads wafers onto support pins 212 and/or unloads wafers from support pins 212.

In some implementations, TCP 200 may be utilized at the beginning or the end of a semiconductor processing flow for a wafer. For example, TCP 200 may be a 2-5 TCP. A 2-5 TCP is a transition chill plate that is used to cool a wafer at the end of a semiconductor processing flow in which the wafer is processed through one or more semiconductor processing steps. The wafer may be transferred to the 2-5 TCP from a final processing stage (e.g., a 2-14 or a 2-24 high speed low temperature hot plate (HSL) or a 2-23 precision chilling hot plate process station (PCH) by a process robot), and a robotic arm may transfer the wafer from the 2-5 TCP to a wafer cassette. In these examples, TCP 200 may be positioned below a 2-6 transition stage (TRS) unit, which is a transition stage unit in which wafers are placed prior to a semiconductor processing flow. The robotic arm may transfer the wafers from a wafer cassette to the 2-6 TRS such that the wafers may be processed through the semiconductor processing flow. Accordingly, including wafer handler cleaning tool 100 in TCP 200 instead of the 2-6 TRS prevents wafer handler cleaning tool 100 from blocking the entrance or opening to the 2-6 TRS. Moreover, including wafer handler cleaning tool 100 in TCP 200 (e.g., a 2-5 TCP) ensures that wafer handler cleaning tool 100 cleans the wafer handler during the transfer of each wafer from TCP 200 to a wafer cassette, which ensures that the wafer handler is cleaned more frequently relative to manual cleaning procedures.

The number and arrangement of components shown in FIG. 2 is provided as an example. In practice, the devices of FIG. 2 may include additional components, fewer components, different components, or differently arranged components than those shown in FIG. 2.

Figure 3:
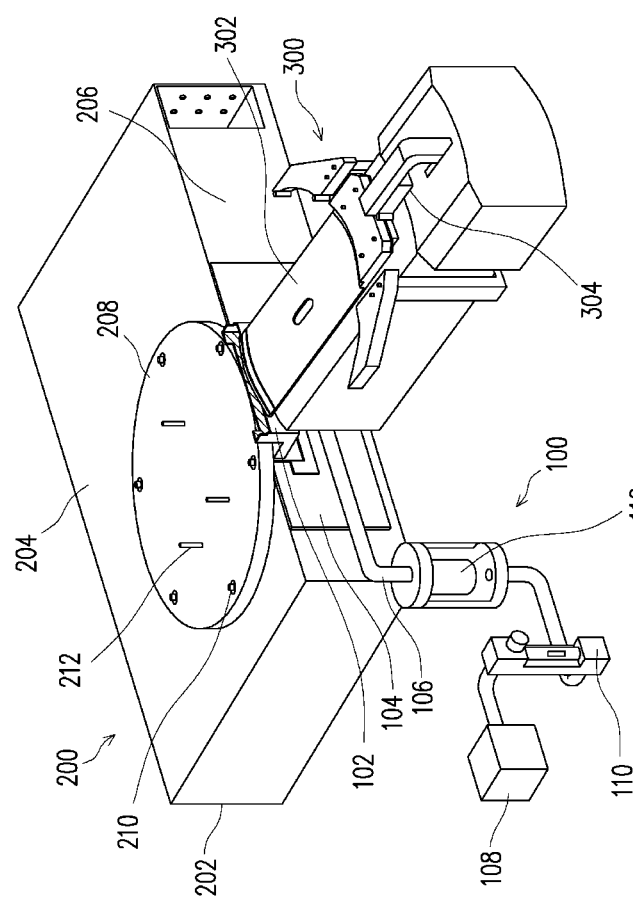
FIG. 3 is a diagram of an example transition chill plate, including the wafer handler cleaning tool of FIGS. 1A and 1B, and a wafer handler.

FIG. 3 is a diagram of TCP 200, including wafer handler cleaning tool 100, and a robotic arm 300. Wafer handler cleaning tool 100 may be a device or set of devices configured to remove foreign objects, debris, and/or other types of matter from an underside of wafer handler 302 included in the robotic arm 300. The robotic arm 300 may be configured to transfer wafers between a wafer cassette and TCP 200.

As shown in FIG. 3, robotic arm 300 may further include a track 304 along which wafer handler 302 may travel. Track 304 permits wafer handler 302 to extend outward relative to robot arm 300 to load wafers into and unload wafers from TCP 200. As further shown in FIG. 3, as wafer handler 302 travels along track 304 to extend outward and into TCP 200, wafer handler 302 may travel through opening 118 of wafer handler cleaning tool 100. As wafer handler 302 travels through opening 118, scraping edge 116 may remove foreign objects, debris, and/or other types of matter from the underside of wafer handler 302. The removed foreign objects, debris, and/or other types of matter may be drawn through drain line 106 by negative pressure device 108, and may be collected, trapped, or caught by filtration device 112.

The number and arrangement of components shown in FIG. 3 is provided as an example. In practice, the devices of FIG. 3 may include additional components, fewer components, different components, or differently arranged components than those shown in FIG. 3.

Figure 4:
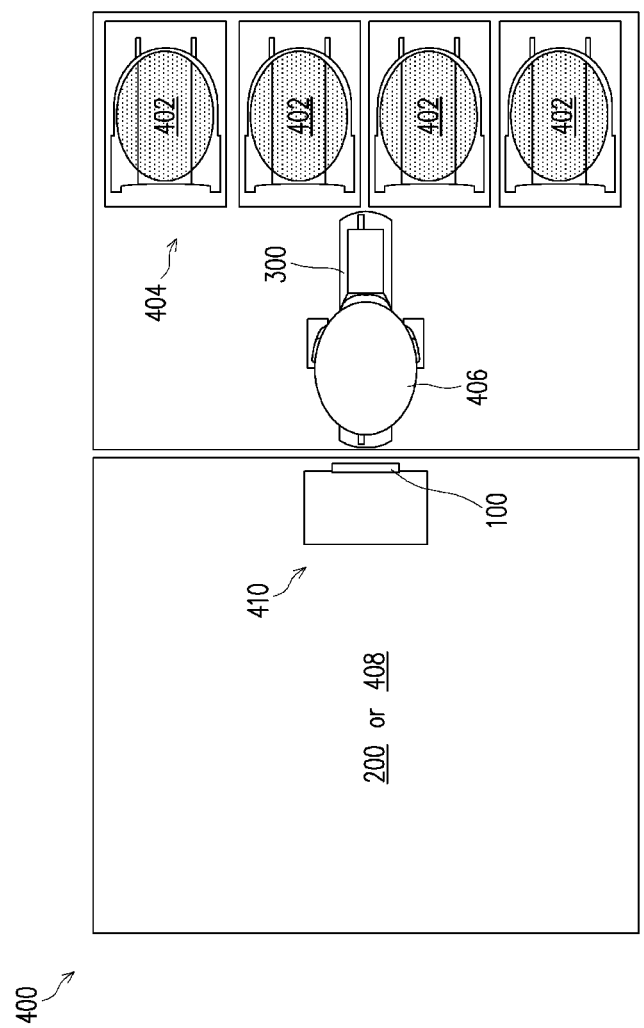
FIG. 4 is a diagram of an example environment in which systems and/or methods described herein may be implemented.

FIG. 4 is a diagram of an example environment 400 in which systems and/or methods described herein may be implemented. As shown in FIG. 4, environment 400 may include one or more wafer cassettes 402 configured into a wafer cassette block 404, a robotic arm 300 including a wafer handler 302 configured to hold a wafer 406, a wafer handler cleaning tool 100, and a TCP 200 or a semiconductor processing chamber 408. The tools and/or devices included in example environment 400 may be included in a semiconductor clean room, a semiconductor foundry, a semiconductor processing and/or manufacturing facility, and/or the like.

Wafer cassette 402 may include a device configured to hold and/or store a plurality of wafers 406. For example, wafer cassette 402 may include a plurality of slots. The plurality of slots may be vertically stacked in wafer cassette 402. Each of the plurality of slots may be configured to hold or store a wafer 406. Wafer cassette block 404 may include a row of a plurality of wafer cassettes 402. In some implementations, each wafer cassette 402 may hold or store a wafer lot. In some implementations, wafer cassette block 404 may hold or store a wafer lot across a plurality of wafer cassettes 402.

In some implementations, robotic arm 300 may include a cassette block robotics arm (CRA) associated with wafer cassette block 404 and configured to transfer wafers 406 between TCP 200 and a wafer cassette 402. Robotic arm 300 may be capable of rotating wafer handler 302 180 degrees and/or 360 degrees to transfer wafers 406 between TCP 200 and a wafer cassette 402. For example, robotic arm 300 may be capable of extending wafer handler 302 into TCP 200 to load a wafer 406 into TCP 200, to unload a wafer 406 from TCP 200, and/or the like. As another example, robotic arm 300 may be capable of extending wafer handler 302 into a wafer cassette 402 to load a wafer 406 into the wafer cassette 402, to unload a wafer 406 from the wafer cassette 402, and/or the like.

In some implementations, robotic arm 300 may include a processing chamber loading arm associated with semiconductor processing chamber 408 and configured to transfer wafers 406 between semiconductor processing chamber 408 and a wafer cassette 402. Robotic arm 300 may be capable of rotating wafer handler 302 180 degrees and/or 360 degrees to transfer wafers 406 between semiconductor processing chamber 408 and a wafer cassette 402. For example, robotic arm 300 may be capable of extending wafer handler 302 into semiconductor processing chamber 408 to load a wafer 406 into semiconductor processing chamber 408, to unload a wafer 406 from semiconductor processing chamber 408, and/or the like. As another example, robotic arm 300 may be capable of extending wafer handler 302 into a wafer cassette 402 to load a wafer 406 into the wafer cassette 402, to unload a wafer 406 from the wafer cassette 402, and/or the like.

Semiconductor processing chamber 408 may include a processing chamber or tool configured to perform one or more semiconductor processing steps on a wafer 406. For example, semiconductor processing chamber 408 may include a pre-clean chamber, a deposition chamber, an etching camber, a lithography chamber, or another type of semiconductor processing chamber.

Wafer handler cleaning tool 100 may be located and/or positioned at and/or near an opening 410 of TCP 200 and/or semiconductor processing chamber 408. In this way, wafer handler cleaning tool 100 may clean an underside of wafer handler 302 as wafer handler 302 enters TCP 200 or semiconductor processing chamber 408 through opening 410 to load and/or unload a wafer 406. Wafer handler cleaning tool 100 may clean the underside of wafer handler 302 by removing foreign objects, debris, and/or other types of matter from the underside or bottom of wafer handler 302.

The number and arrangement of devices and networks shown in FIG. 4 are provided as one or more examples. In practice, there may be additional devices, fewer devices, different devices, or differently arranged devices than those shown in FIG. 4. Furthermore, two or more devices shown in FIG. 4 may be implemented within a single device, or a single device shown in FIG. 4 may be implemented as multiple, distributed devices. Additionally, or alternatively, a set of devices (e.g., one or more devices) of environment 400 may perform one or more functions described as being performed by another set of devices of environment 400.

Figure 5A:
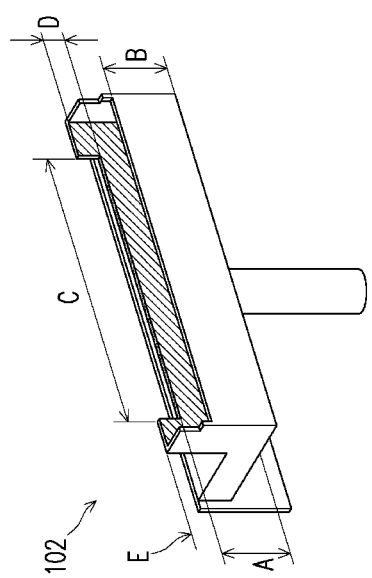

FIGS. 5A-5D are diagrams illustrating example parameters for scraping device 102, wafer handler 302, and a slot of wafer cassette 402. As shown in FIG. 5A, an example parameter A may be a height of back wall 122. An example parameter B may be a height of front wall 120. An example parameter C may be a width of opening 118. An example parameter D may be a height of sidewalls 114 relative to the height of back wall 122. An example parameter E may be a top level of sidewalls 114.

Figure 5B:
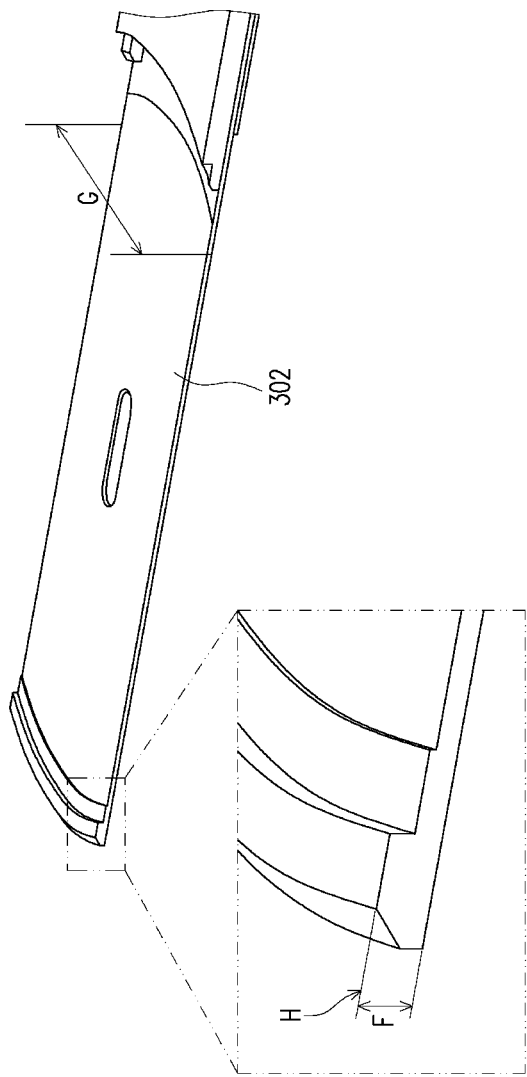

As shown in FIG. 5B, an example parameter F may be a thickness of wafer handler 302. An example parameter H may be a height or top level of a top side of wafer handler 302. An example parameter G may be a width of wafer handler 302. As shown in FIG. 5C, an example parameter I may be a gap size between the underside of wafer handler 302 and scraping edge 116. As shown in FIG. 5D, an example parameter J may be a gap size between the underside of wafer handler 302 and a top side of a wafer 406 in a slot of wafer cassette 402 below wafer handler 302.

The height of back wall 122 may be greater than the height of front wall 120 (e.g., parameter A>parameter B) such that foreign objects, debris, and/or other types of matter removed from the underside of wafer handler 302 by scraping edge 116 falls into trough 126 as wafer handler 302 travels through opening 118. The width of opening 118 may be greater than the width of wafer handler 302 (e.g., parameter C>parameter G) such that wafer handler 302 is permitted to travel through opening 118. The height of sidewalls 114 may be greater than the thickness of wafer handler 302 (e.g., parameter D>parameter F) such that the top level of sidewalls 114 is greater than or higher than the top level of wafer handler 302 (e.g., parameter E>parameter H). The gap size between the underside of wafer handler 302 and scraping edge 116 may be less than the gap size between the underside of wafer handler 302 and the top side of the wafer 406 in the slot of wafer cassette 402 below wafer handler 302 (parameter I<parameter J). In this way, scraping edge 116 removes foreign objects, debris, and/or other types of matter from the underside of wafer handler 302 that are sized equal to or larger than the gap size between the underside of wafer handler 302 and the top side of the wafer 406, which prevents the foreign objects, debris, and/or other types of matter from causing damage to wafer 406.

As indicated above, FIGS. 5A-5D are provided as one or more examples. Other examples may differ from what is described with regard to FIGS. 5A-5D.

Figure 6:
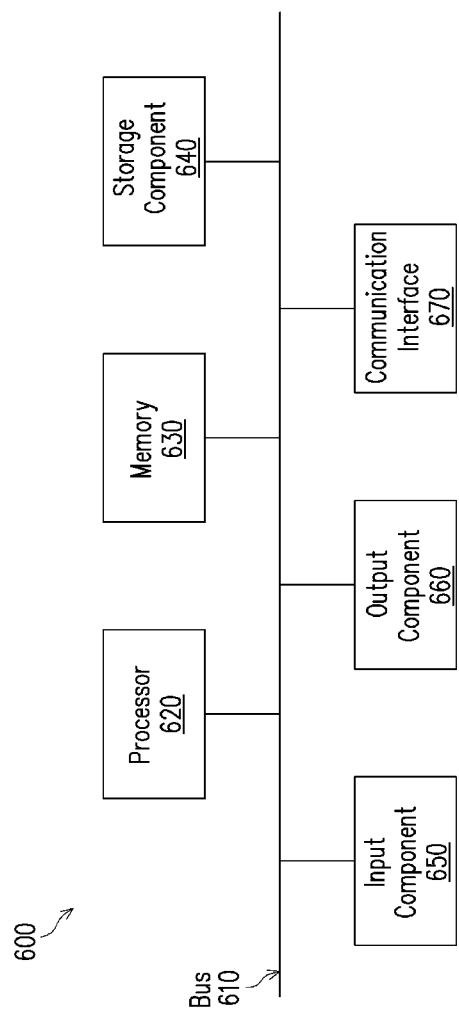
FIG. 6 is a diagram of example components of one or more devices described herein.

FIG. 6 is a diagram of example components of a device 600. In some implementations, wafer handler cleaning tool 100, TCP 200, wafer handler 302, robotic arm 300, and/or semiconductor processing chamber 408 may include one or more devices 600 and/or one or more components of device 600. As shown in FIG. 6, device 600 may include a bus 610, a processor 620, a memory 630, a storage component 640, an input component 650, an output component 660, and a communication interface 670.

Bus 610 includes a component that permits communication among multiple components of device 600. Processor 620 is implemented in hardware, firmware, and/or a combination of hardware and software. Processor 620 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 620 includes one or more processors capable of being programmed to perform a function. Memory 630 includes a random access memory (RAM), a read only memory (ROM), and/or another type of dynamic or static storage device (e.g., a flash memory, a magnetic memory, and/or an optical memory) that stores information and/or instructions for use by processor 620.

Storage component 640 stores information and/or software related to the operation and use of device 600. For example, storage component 640 may include a hard disk (e.g., a magnetic disk, an optical disk, and/or a magneto-optic disk), a solid state drive (SSD), a compact disc (CD), a digital versatile disc (DVD), a floppy disk, a cartridge, a magnetic tape, and/or another type of non-transitory computer-readable medium, along with a corresponding drive.

Input component 650 includes a component that permits device 600 to receive information, such as via user input (e.g., a touch screen display, a keyboard, a keypad, a mouse, a button, a switch, and/or a microphone). Additionally, or alternatively, input component 650 may include a component for determining location (e.g., a global positioning system (GPS) component) and/or a sensor (e.g., an accelerometer, a gyroscope, an actuator, another type of positional or environmental sensor, and/or the like). Output component 660 includes a component that provides output information from device 600 (via, e.g., a display, a speaker, a haptic feedback component, an audio or visual indicator, and/or the like).

Communication interface 670 includes a transceiver-like component (e.g., a transceiver, a separate receiver, a separate transmitter, and/or the like) that enables device 600 to communicate with other devices, such as via a wired connection, a wireless connection, or a combination of wired and wireless connections. Communication interface 670 may permit device 600 to receive information from another device and/or provide information to another device. For example, communication interface 670 may include an Ethernet interface, an optical interface, a coaxial interface, an infrared interface, a radio frequency (RF) interface, a universal serial bus (USB) interface, a Wi-Fi interface, a cellular network interface, and/or the like.

Device 600 may perform one or more processes described herein. Device 600 may perform these processes based on processor 620 executing software instructions stored by a non-transitory computer-readable medium, such as memory 630 and/or storage component 640. As used herein, the term "computer-readable medium" refers to a non-transitory memory device. A memory device includes memory space within a single physical storage device or memory space spread across multiple physical storage devices.

Software instructions may be read into memory 630 and/or storage component 640 from another computer-readable medium or from another device via communication interface 670. When executed, software instructions stored in memory 630 and/or storage component 640 may cause processor 620 to perform one or more processes described herein. Additionally, or alternatively, hardware circuitry may be used in place of or in combination with software instructions to perform one or more processes described herein. Thus, implementations described herein are not limited to any specific combination of hardware circuitry and software.

The number and arrangement of components shown in FIG. 6 are provided as an example. In practice, device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

In this way, a wafer handler cleaning tool includes a scraping device positioned near semiconductor equipment (e.g., a cooling plate, a semiconductor processing device, and/or the like) such that the scraping device removes foreign objects, debris, and/or other types of matter from the underside of the wafer handler when the wafer handler loads a wafer into the semiconductor equipment and/or unloads the wafer from the semiconductor equipment. Moreover, the wafer handler cleaning tool may include a negative pressure device to draw the removed foreign objects, debris, and/or other types of matter away from the scraping device and toward a filtration device such that the filtration device captures the removed foreign objects, debris, and/or other types of matter. Thus, the wafer handler cleaning tool may clean the underside of the wafer handler prior to the wafer handler transferring a wafer to and/or from a wafer cassette. This reduces the likelihood of and/or prevents damage from occurring to another wafer that is loaded in a slot below the wafer in the wafer cassette. Moreover, the wafer handler cleaning tool may automatically clean the underside of the wafer handler, which reduces the downtime of the wafer handler that would otherwise result from manual cleaning of the wafer handler and allows for the wafer handler to be cleaned more frequently.

As described in greater detail above, some implementations described herein provide a wafer handler cleaning tool. The wafer handler cleaning tool includes a scraping device to remove debris from an underside of a robotic wafer handler. The wafer handler cleaning tool includes a negative pressure device to cause the debris, removed from the underside of the robotic wafer handler by the scraping device, to travel through a drain line. The wafer handler cleaning tool includes a filtration device to filter the debris from the drain line.

As described in greater detail above, some implementations described herein provide a wafer handler cleaning tool. The wafer handler cleaning tool includes a scraping device and a filtration device. The scraping device includes a scraping edge to remove foreign objects from of an underside of a robotic wafer handler as the robotic wafer handler loads a wafer to a chill plate or unloads the wafer from the chill plate. The scraping device includes a trough to collect the foreign objects removed from the underside of the robotic wafer handler. The scraping device includes a drain port to provide the foreign objects from the trough to a drain line. The filtration device is to filter the foreign objects from the drain line.

As described in greater detail above, some implementations described herein provide a transition chill plate (TCP). The TCP includes a chill plate to cool a wafer after the wafer is processed through one or more semiconductor processing steps. The TCP includes a wafer handler cleaning tool. The wafer handler cleaning tool includes a mounting plate attached to a front side of TCP. The wafer handler cleaning tool includes a scraping device supported by the mounting plate and positioned to remove matter of at least a threshold size from an underside of a robotic wafer handler as the robotic wafer handler travels through an opening of the scraping device to unload the wafer from the chill plate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer handler cleaning tool, comprising:
    a scraping device configured to remove debris from an underside of a robotic wafer handler as the robotic wafer handler travels through an opening of the scraping device to load a wafer onto a transition chill plate or unload the wafer from the transition chill plate;
    a negative pressure device configured to cause the debris, removed from the underside of the robotic wafer handler by the scraping device, to travel through a drain line; and
    a filtration device configured to filter the debris from the drain line.

2. The wafer handler cleaning tool of claim 1, further comprising:
    a flow meter configured to provide an indication of a flow rate through the drain line.

3. The wafer handler cleaning tool of claim 2, wherein the filtration device is configured to filter the debris to prevent the debris from causing a blockage at the flow meter.

4. The wafer handler cleaning tool of claim 1, wherein the wafer handler cleaning tool is positioned between the transition chill plate and a cassette block robotics arm (CRA) in which the robotic wafer handler is included; and
    wherein the scraping device is configured to remove the debris from the underside of the robotic wafer handler as the CRA loads the wafer onto the transition chill plate or unloads the wafer from the transition chill plate.

5. The wafer handler cleaning tool of claim 1, wherein the wafer handler cleaning tool is positioned between a semiconductor processing chamber and a processing chamber loading arm in which the robotic wafer handler is included; and
    wherein the scraping device is configured to remove the debris from the underside of the robotic wafer handler as the processing chamber loading arm loads the wafer into the semiconductor processing chamber or unloads the wafer from the semiconductor processing chamber.

6. A wafer handler cleaning tool, comprising:
    a scraping device, comprising:
        a scraping edge configured to remove foreign objects from of an underside of a robotic wafer handler as the robotic wafer handler travels through an opening, formed by the scraping edge and a pair of sidewalls on opposing sides of the scraping edge, to load a wafer onto a chill plate or unload the wafer from the chill plate,
        a trough configured to collect the foreign objects removed from the underside of the robotic wafer handler, and
        a drain port configured to provide the foreign objects from the trough to a drain line; and
    a filtration device configured to filter the foreign objects from the drain line.

7. The wafer handler cleaning tool of claim 6, wherein a width of the opening is greater than a width of the robotic wafer handler.

8. The wafer handler cleaning tool of claim 6, wherein a height of the opening is greater than a thickness of the robotic wafer handler.

9. The wafer handler cleaning tool of claim 6, wherein a height of a back wall of the trough is greater than a height of a front wall of the trough.

10. The wafer handler cleaning tool of claim 6, wherein a height of the opening is greater than a height of the robotic wafer handler as the robotic wafer handler travels through the opening.

11. The wafer handler cleaning tool of claim 6, further comprising:
a negative pressure device configured to cause the foreign objects, removed from the underside of the robotic wafer handler by the scraping device, to travel from the trough and through the drain line to the filtration device.

12. A transition chill plate (TCP), comprising:
a chill plate configured to cool a wafer after the wafer is processed through one or more semiconductor processing steps; and
a wafer handler cleaning tool, comprising:
a mounting plate attached to a front side of the TCP; and
a scraping device supported by the mounting plate and positioned to remove matter of at least a threshold size from an underside of a robotic wafer handler as the robotic wafer handler travels through an opening of the scraping device to unload the wafer from the chill plate.

13. The TCP of claim 12, wherein the TCP is positioned below another TCP that is to hold the wafer prior to being processed through the one or more semiconductor processing steps.

14. The TCP of claim 12, wherein the scraping device is positioned to remove the matter from the underside of the robotic wafer handler as the robotic wafer handler unloads the wafer from the chill plate prior to loading the wafer into a wafer cassette slot; and
wherein a gap between a bottom of the wafer cassette slot and the underside of the robotic wafer handler is greater than a gap between a scraping edge of the scraping device and the underside of the robotic wafer handler.

15. The TCP of claim 12, wherein a gap between a scraping edge of the scraping device and the underside of the robotic wafer handler is equal to the threshold size.

16. The TCP of claim 12, wherein the scraping device is configured to remove the matter from the underside of the robotic wafer handler as the robotic wafer handler travels into the TCP.

17. The TCP of claim 12, wherein the opening is between two sidewalls of the scraping device; and
wherein a height of the two sidewalls is greater than a height of a front wall of the scraping device.

18. The TCP of claim 12, wherein the wafer handler cleaning tool further comprises:
a trough configured to collect the matter removed from the underside of the robotic wafer handler; and
a negative pressure device configured to cause the matter, removed from the underside of the robotic wafer handler by the scraping device, to travel from the trough and through a drain line connected to a drain port of the trough.

19. The TCP of claim 18, wherein the wafer handler cleaning tool further comprises:
a filtration device configured to filter the matter, removed from the underside of the robotic wafer handler by the scraping device, from the drain line.

20. The wafer handler cleaning tool of claim 6, further comprising:
a flow meter configured to provide an indication of a flow rate through the drain line.

* * * * *